(12) United States Patent
Glowinke

(10) Patent No.: US 7,482,688 B2
(45) Date of Patent: Jan. 27, 2009

(54) ATTACHING HEAT SINKS TO INTEGRATED CIRCUIT PACKAGES

(75) Inventor: Tom S. Glowinke, Naperville, IL (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 300 days.

(21) Appl. No.: 11/411,627

(22) Filed: Apr. 26, 2006

(65) Prior Publication Data

US 2007/0253165 A1 Nov. 1, 2007

(51) Int. Cl.
*H01L 23/34* (2006.01)
*F28F 7/00* (2006.01)
*H05K 7/20* (2006.01)

(52) U.S. Cl. .................. 257/713; 361/704; 361/709; 165/80.2; 174/16.3

(58) Field of Classification Search .............. 361/704, 361/709, 710; 257/713; 165/80.2, 80.3; 174/16.3
See application file for complete search history.

(56) References Cited

U.S. PATENT DOCUMENTS 7,130,197 B2 * 10/2006 Chin ........................... 361/719
2005/0064242 A1 * 3/2005 Schneider et al. ........ 428/694 B

OTHER PUBLICATIONS

IBM Technical Disclosure Bulletin Document NN9403225, Mar. 1, 1994.*

* cited by examiner

*Primary Examiner*—Jayprakash N Gandhi
*Assistant Examiner*—Zachary M Pape

(57) ABSTRACT

This invention relates to arrangements for attaching a heat sink to an integrated circuit package. The heat sink comprises magnetic material, magnetized in one polarity, and the circuit package comprises magnetic material either unmagnetized or magnetized in the opposite polarity. When the heat sink and circuit package are placed in contact with one another, they are attracted magnetically. This forms a bond for attaching the heat sink to the integrated circuit package. Advantageously, this arrangement for attracting a heat sink avoids distorting or otherwise damaging the circuit package and speeds assembly time.

2 Claims, 1 Drawing Sheet

ATTACHING HEAT SINKS TO INTEGRATED CIRCUIT PACKAGES

TECHNICAL FIELD

This invention relates to methods and apparatus for attaching heat sinks to integrated circuit packages.

BACKGROUND OF THE INVENTION

Integrated circuit packages of modern electronic equipment(s) usually run at substantially elevated temperatures. In order to lengthen the lifetime of the devices on these circuit package assemblies, the heat generated must be dissipated. The most frequent arrangement for dissipating the heat is to attach a heat sink to the integrated circuit package. The heat sink allows the heat to be dissipated into the air or in some cases into liquids. For the heat sinks to be effective, it is necessary that they be attached to the integrated circuit package in such a way that heat is readily transferred from the integrated circuit package to the heat sink.

The most common arrangements for attaching heat sinks to integrated circuit packages are glue, clip arrangements, and screw arrangements. None of these are particularly satisfactory. The glue is not stable over wide temperature ranges. The adhesion life is frequently limited. The glue is difficult to apply and requires time to cure, dry and set. Further, a maximum time must not be exceeded before the two elements to be glued together are placed in contact.

Clip arrangements frequently have poor mechanical adhesion, have a low contact surface area, can fall off in the presence of shock, and may have problems from limited or degradation of the spring tension.

Screw arrangements are difficult to apply, may require manual effort, and are unreliable if the torque force applied to the screw is inconsistent from circuit package to circuit package. Further, the screw arrangements can distort or damage the underlying circuit board, the integrated circuit device or the integrated circuit package.

Accordingly, a problem of the prior art is that none of the arrangements for attaching a heat sink to the integrated circuit package are fully satisfactory.

SUMMARY OF THE INVENTION

The above problem is substantially alleviated and a contribution is made over the teachings of the prior art in accordance with Applicant's invention wherein the integrated circuit package comprises a magnet or magnetic material and the heat sink itself comprises a magnet or magnetic material; accordingly a magnetic force causes the heat sink to adhere to the integrated circuit package when the two are placed in contact with each other. Advantageously, this arrangement provides a uniform bond between the integrated circuit package and the heat sink and avoids distorting or damaging the integrated circuit package, electronic device or printed wiring board. Advantageously, the material of the integrated circuit package and of the heat sink can be selected to provide the required adhesion force to fasten the heat sink to the to the integrated circuit package. Alignment can be automatically achieved by having the shape of the heat sink match an appropriately shaped magnetic material element embedded in the integrated circuit package.

DETAILED DESCRIPTION

Figure 1:
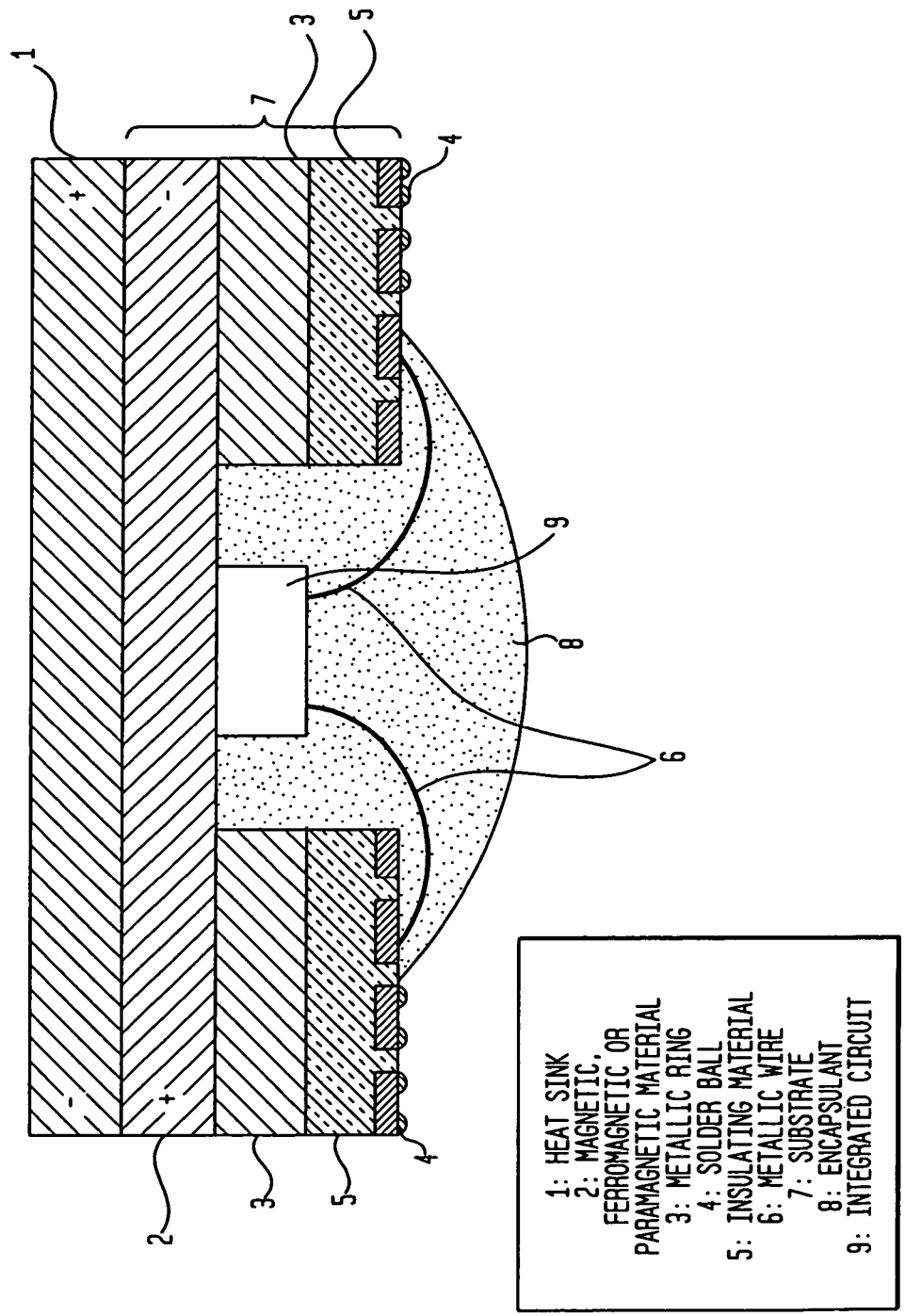
FIG. 1 is a diagram illustrating the attachment of a heat sink to an integrated circuit package in accordance with the principles of Applicant's invention.

FIG. 1 is a diagram illustrating Applicant's invention. A heat sink 1 comprising magnetic material in one polarity can be bonded through magnetic attraction to a slice of magnetic material 2 either unmagnetized or magnetized of the opposite polarity that was embedded in the substrate during the integrated circuit packaging assembly process. The substrate 7 consists of elements 2, 3, 5, and 6. The slice 2 of magnetic material (which may or may not be initially magnetized) is bonded to a metallic ring (e.g., copper shown in the figure) 3 which is in turn bonded to insulating material 5 of the substrate 7. This example also shows a complete assembly with the package containing conducting wires 6 for connecting the integrated circuit 9 to the substrate bonding pads. These wires are then subsequently immersed in an encapsulant 8 for protection and moisture resistance. Solder balls 4 are used to connect the integrated circuit package to a Printed Wiring Board so that when the circuit package is affixed to a connector, the circuit package assembly can be connected to the rest of the larger system.

When the circuit package assembly is manufactured, the magnetic material 1 (which is magnetized to have a sufficient magnetic field strength) can be easily bonded to element 2 of the integrated circuit package because of the magnetic attraction between the heat sink and the magnetic material of element 2. The strength of the magnetic bond can be adjusted by appropriate selection of the magnetic field strength of the materials used. Advantageously, this type of arrangement allows the force of magnetic attraction to be used to bond a heat sink to the substrate of an integrated circuit package.

In one preferred embodiment, the magnetic material 2 is made of an iron plate attached during the construction of the substrate. This material is inexpensive and serves to spread heat over the surface of the circuit package.

The heat sink could be made of AlNiCo, an alloy of aluminum, nickel and cobalt, commercially available with excellent magnetic properties (i.e. suitable magnetic field strength). The strength of the AlNiCo magnetic field is adjusted via the sintering manufacturing process by proper selection of permeability, time and strength of the aligning magnetic field. AlNiCo also has a sufficiently high Curie temperature (860° C.) so it will not be degraded by the typical operating temperatures of the electronic equipment.

Other examples of materials which can be used for the heat sink in accordance with this invention include samarium cobalt, ferrite ceramic, and neodynamium iron boron.

More generally, the typical manufacturing processes for permanent magnets to be used as the heat sink include sintering, pressure bonding, casting, extruding and calendaring.

The above description is of one preferred embodiment of Applicant's invention. Other embodiments will be apparent to those of ordinary skill in the art. The invention is limited only by the attached claims.

I claim:

1. An integrated circuit package comprising:

a substrate interconnecting a plurality of devices; and a heat sink;

wherein said heat sink comprises magnetic material;

wherein said substrate comprises magnetic material;

wherein, when said heat sink is brought into proximity with said substrate, a bond between said substrate and said heat sink is formed due to magnetic attraction between said substrate and said heat sink;

said substrate further comprising a block of high heat conductivity material surrounding and in close proximity to said plurality of devices to distribute heat of said plurality of devices;

said high heat conductivity material in proximity with said magnetic material of said substrate to conduct heat from said plurality of devices toward said heat sink.

2. The apparatus of claim 1 wherein said block of high heat conductivity material comprises a copper ring surrounding one of said plurality of devices.

* * * * *